US010581150B2

(12) United States Patent
Heuel et al.

(10) Patent No.: US 10,581,150 B2
(45) Date of Patent: Mar. 3, 2020

(54) METHOD AND APPARATUS FOR RADAR ACCURACY MEASUREMENTS

(71) Applicant: Rohde & Schwarz GmbH & Co. KG, Munich (DE)

(72) Inventors: Steffen Heuel, Munich (DE); Sherif Ahmed, Starnberg (DE); Andreas Schiessl, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 258 days.

(21) Appl. No.: 15/494,092

(22) Filed: Apr. 21, 2017

(65) Prior Publication Data
US 2018/0306903 A1 Oct. 25, 2018

(51) Int. Cl.
*H01Q 1/42* (2006.01)
*G01S 7/40* (2006.01)
*G01R 29/08* (2006.01)

(52) U.S. Cl.
CPC .......... *H01Q 1/42* (2013.01); *G01R 29/0835* (2013.01); *G01S 7/40* (2013.01); *H01Q 1/421* (2013.01); *G01S 2007/4086* (2013.01)

(58) Field of Classification Search
CPC ... G01R 27/28; G01S 2007/4086; G01S 7/40; G01S 7/4052; H01Q 1/42; H01Q 1/421
USPC ........................................................ 342/169
See application file for complete search history.

(56) References Cited

U.S. PATENT DOCUMENTS

| | | | | | |
|---|---|---|---|---|---|
| 3,953,850 | A | * | 4/1976 | Redman | G01S 7/4021 342/167 |
| 5,047,782 | A | * | 9/1991 | Lew | G01S 7/4052 342/169 |
| 5,066,921 | A | * | 11/1991 | Rope | B82Y 15/00 324/639 |
| 5,371,505 | A | * | 12/1994 | Michaels | H01Q 1/42 324/639 |
| 5,485,159 | A | * | 1/1996 | Zhang | G01S 7/4004 340/580 |
| 6,260,415 | B1 | * | 7/2001 | Goebel | G01D 5/48 73/582 |
| 7,432,856 | B1 | * | 10/2008 | Hornbostel | G01S 1/028 342/169 |
| 10,054,623 | B2 | * | 8/2018 | Estebe | H01Q 3/267 |
| 2008/0265999 | A1 | * | 10/2008 | Wan | H03L 7/07 331/16 |
| 2009/0058715 | A1 | * | 3/2009 | Sarafian | G01S 7/4052 342/169 |
| 2009/0135076 | A1 | * | 5/2009 | Foo | H01Q 1/246 343/836 |

(Continued)

FOREIGN PATENT DOCUMENTS

CN 103913470 A * 3/2014
WO 2015043935 A1 4/2015

*Primary Examiner* — Timothy X Pham
(74) *Attorney, Agent, or Firm* — Ditthavong & Steiner, P.C.

(57) ABSTRACT

A test setup for measuring the impact of radar antenna covers is provided. The test setup comprises a radar sensor antenna configured to receive radar radiation and to generate radar radiation, a test antenna configured to generate radar radiation and to receive radar radiation and a radar sensor antenna cover that covers the radar sensor antenna. The test antenna comprises several antenna elements in elevation and/or azimuth direction.

16 Claims, 4 Drawing Sheets

(56) References Cited

U.S. PATENT DOCUMENTS

2014/0300519 A1* 10/2014 Estebe .................. H01Q 3/267
343/703
2017/0010346 A1* 1/2017 Rolfsmeier ........... G01S 7/4026

* cited by examiner

METHOD AND APPARATUS FOR RADAR ACCURACY MEASUREMENTS

TECHNICAL FIELD

The invention relates to a test setup and test method for evaluating the impact of radar antenna covers on radar waves. The test setup comprises a test antenna, a radar sensor antenna and a radar sensor antenna cover.

BACKGROUND ART

Generally, radar antennas are covered with a weatherproof enclosure, called a radom or bumper to protect the antenna. Even though the radom/bumper is constructed of material that minimally influences the radar waves, the angular accuracy of a radar sensor is affected and the antenna beam pattern is distored. Thus is a need for a measurement method and setup to measure the effects on the radar wave caused by the radom/bumper.

WO 2015/043935 A1 discloses a method for monitoring a cover of a Doppler radar sensor of a rail vehicle, using two adjacent antenna arrays, wherein a first radio signal is transmitted by a first antenna array, the said radio signal is at least partly reflected by the cover to be monitored and measured by a second antenna array. On the basis of the reflected signal, measured by the second antenna, dirt present on the cover is automatically detected. However, said document does not show a test antenna comprising several antenna elements in elevation and/or azimuth direction to evaluate the effect of radar waves caused by a radom or bumper. WO 2015/043935 A1 only detects dirt on a cover based on reflection measurements, wherein the transmitting antenna array and the receiving antenna array are located at the same side of the cover and since said document does not disclose the measurement of the influence on the radom/bumper material on radar waves with a test antenna. There is a need to provide a system and method with a test antenna, a radar sensor antenna, a radar sensor antenna cover.

SUMMARY OF THE INVENTION

According to a first aspect of the invention, a test setup for measuring the impact of radar antenna covers is provided. Said test setup comprises a test antenna configured to generate radar radiation and to receive radar radiation, a radar sensor antenna configured to receive radar radiation and to generate radar radiation and a radar sensor antenna cover that covers the radar sensor antenna. The test antenna itself comprises several antenna elements in elevation and/or azimuth direction. Advantageously, due to the test antenna comprising several antenna elements in elevation and/or azimuth direction, radar radiation for evaluating the sensor cover material under real conditions can be generated.

According to a first preferred implementation form of the first aspect, additionally or alternatively, the test setup comprises an analyzer unit configured to evaluate the radar sensor antenna cover based on generated and received radar sensor antenna data and/or test antenna data based on measurements with and without the radar sensor antenna cover. Based on the data generated with the radar sensor antenna cover and additionally based on the data generated without the radar sensor antenna cover, the impact of any material covering the radar sensor antenna can be evaluated.

According to a further preferred implementation form of the first aspect, the radar radiation generated by the test antenna is such, that radar echos are emitted. These radar echos simulate the radar echos normally received when radar radiation is emitted and reflected at an object. Thus the generated echos simulate a target.

According to a further preferred implementation form of the first aspect, additionally or alternatively, each of the test antenna elements is configured to be switchable individually.

According to a further preferred implementation form of the first aspect, the switchable test antenna elements are configured to form a beam. Advantageously, the beam can be formed by phased array antennas and can be electronically steered to point in different directions without moving the antenna. In addition a robotic arm is conceivable on which the test antenna is mounted to be able to position the antenna to a specific location.

According to a further preferred implementation form of the first aspect, additionally or alternatively, the switchable test antenna elements are configured to form an interference signal.

According to a further preferred implementation form of the first aspect, additionally or alternatively the switchable test antenna elements are configured to form a multiple simulation signal to simulate multiple targets.

According to a further preferred implementation form of the first aspect, additionally or alternatively the radar sensor antenna is configured to measure the received signal from the test antenna.

According to a further preferred implementation form of the first aspect, additionally or alternatively the radar sensor antenna is configured to measure an angle and/or a range of signals and/or a Doppler signal and/or signal echo power.

According to a further preferred implementation form of the first aspect, additionally or alternatively the radar sensor antenna is a multi-antenna array. Such a multi-antenna array allows to achieve a narrower beam of radar waves, than could be achieved with a single antenna. Multi-antenna arrays allow to steer the radio beam electronically to point in different directions and furthermore antenna arrays can be used to cancel interference from specific directions.

According to a second aspect of the invention, a method for measuring the impact of radar antenna covers is provided. The method comprises a first measurement of radar radiation comprising elevation and/or azimuth data, generated by a test antenna. The first measurement consists of two parts; in part one, the radiation generated by the test antenna is received and measured by the radar sensor antenna directly, without the presence of a material that covers the radar sensor antenna. In part two of the measurement the radiation generated by the test antenna is received and measured with the presence of a material that covers the radar sensor antenna, thus the radiation is received and measured after going through a material that influences the radar radiation. Based on both measurements, with and without the presence of a material that covers the radar sensor antenna, an analysis of the measurement data is conducted and the influence of the material that covers the radar sensor antenna is evaluated.

According to a first preferred implementation form of the second aspect, the method further comprises a second measurement of radar radiation received by the test antenna, both without going through the material that covers the radar sensor antenna and going through the material that covers the radar sensor antenna, and performing an estimation of an antenna beam pattern distortion of the radar sensor antenna, based on this measurement.

According to a further preferred implementation form of the second aspect, additionally or alternatively, the method further comprises the step of configuring the test antenna such that radar echos are generated to simulate a target. This target simulation with a test antenna being capable to generate echos, that are otherwise only generated when radar waves are reflected by an object, allows simulating targets, without the need for real test object. Such a simulation is more accurate and faster to perform than using real objects.

According to a further preferred implementation form of the second aspect, additionally or alternatively, the method further comprises the step of switching antenna elements individually to realize any switching combination of all available antenna elements.

According to a further preferred implementation form of the second aspect, additionally or alternatively, the method further comprises the step that a beam is formed by the test antenna and/or wherein the method further comprises the step that an interference signal is formed by the test antenna. Said beam can be steered electronically to point in different directions without moving the antenna. In addition a test antenna is conceivable that is movable and able to change its position to a desired location.

According to a further preferred implementation form of the second aspect, additionally or alternatively, the method further comprises the step that a multiple simulation signal is formed by the test antenna.

According to a further preferred implementation form of the second aspect, the method further comprises the step that the received signal from the test antenna is measured by the radar sensor antenna.

According to a further preferred implementation form of the second aspect, additionally or alternatively, the method further comprises the step that an angle and/or a range of signals and/or a Doppler signal and/or signal echo power is measured by the radar sensor antenna.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
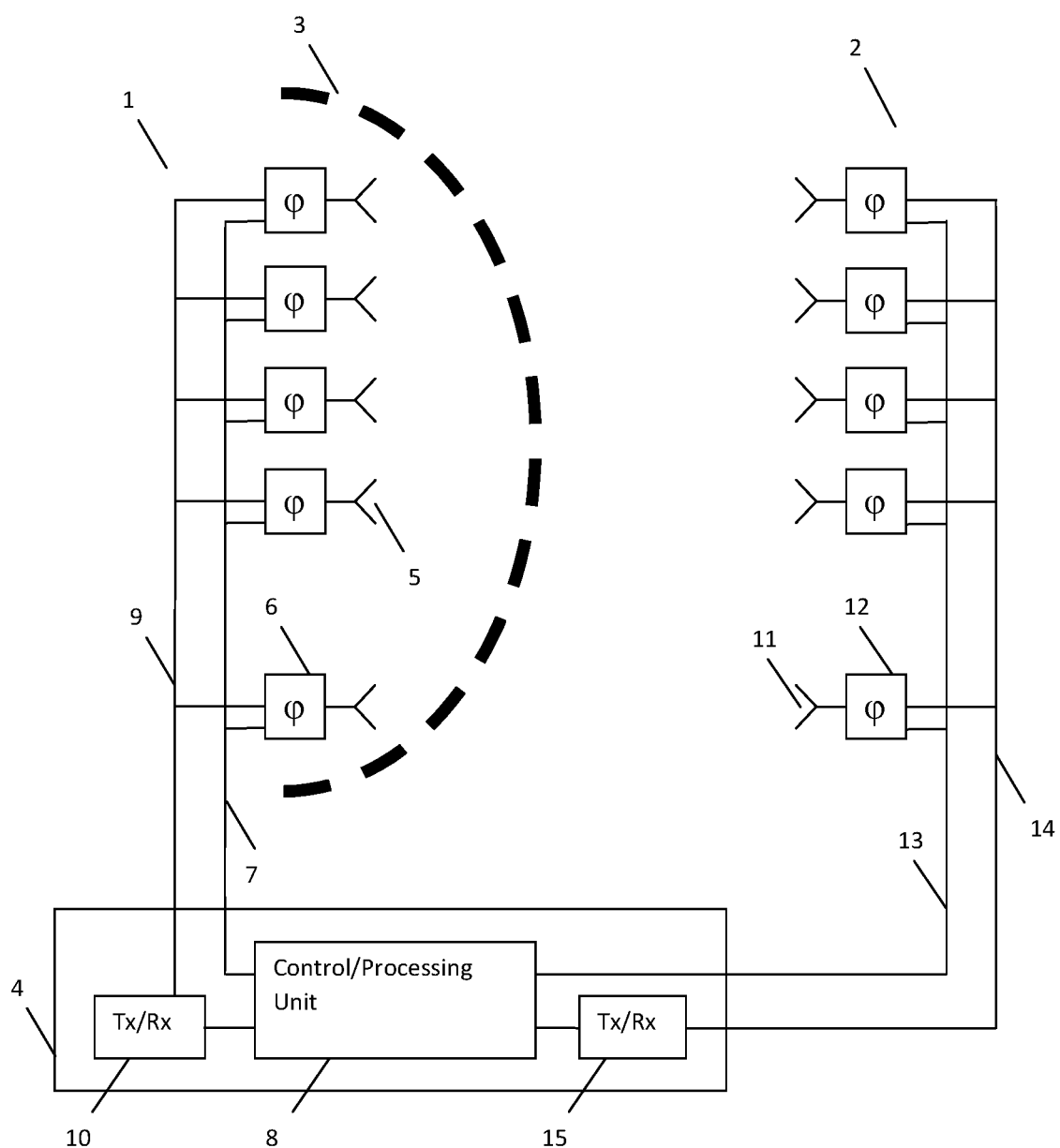
FIG. 1 shows a block diagram of an exemplary test setup of the first aspect of the invention.

FIG. 1 illustrates an exemplary test setup for measuring the impact of radar antenna covers, comprising a radar sensor antenna 1, a test antenna 2, a radar sensor cover 3 and an analyzer unit 4.

The radar sensor antenna 1 may exemplarily be a multi-antenna array consisting of several antenna elements 5, each antenna element 5 being connected to a phase shifter 6. The phase shifters 6 in this exemplary case, are connected via a connection line 7 to a control/processing unit 8 that may be part of the analyzing unit 4, for configuring the phase of the applied signals. Furthermore, the phase shifters 6 are connected via a connection line 9 to a transmission/receiving unit 10 that may be part of the analyzing unit 4, configured to transmit/receive radar signals. The transmission/receiving unit 10 is connected to the control/processing unit 8. It is also conceivable that the transmission/receiving unit 10 and/or the control/processing unit 8 are provided as separate units and are not necessarily included into the analyzer unit 4.

The test antenna 2 comprises several antenna elements 11 in elevation and/or azimuth direction. Furthermore the antenna elements 11 may be exemplarily connected to a phase shifter 12, wherein the phase shifters 12 are connected via a connection line 13 to the control/processing unit 8 that may be part of an analyzing unit 4, for configuring the phase of the applied signals. Furthermore, the phase shifters 12 are connected via a connection line 14 to a transmission/receiving unit 15 that may be part of the analyzing unit 4, configured to transmit/receive radar signals. Thus, the feed current for each antenna element 11 passes through a phase shifter 12. The transmission/receiving unit 15 is connected to the control/processing unit 8. It is also conceivable that the transmission/receiving unit 15 and/or the control/processing unit 8 are provided as separate units and are not necessarily included into the analyzer unit 4.

Based on several antenna elements 11, wherein each element 11 is provided with a phase shifter 12, it is possible to create a beam of radar waves that can be electronically steered to point in different directions, without moving the antennas. Thus, radar radiation is generated, identical to radar echos that are normally generated, when radar radiation is reflected by a real object. Thus, the test antenna 2 is able to simulate targets since the control/processing unit 8 in combination with the transmitter/receiver unit 15 are configured to produce radar echos to simulate targets.

Furthermore, FIG. 1 shows a material 3 that covers the radar sensor antenna 1. The material 3 is located between the radar sensor antenna 1 and the test antenna 2 and influences the radar radiation going through the material 3. However, during the measurements according to step 2, described in FIG. 3 and the measurements according to step 6, described in FIG. 4 no material is present between the two antennas 1, 2 to obtain reference data without a material influencing the radar radiation. For this reason, the cover material 3 is drawn with a dashed line, to point out, that measurements are conducted with the material between the two antennas and without the material between the two antennas.

The analyzing unit 4 compares measurement data taken without material influencing the radar radiation 3, such as a radom, bumper, weather shield or similar that covers the radar sensor antenna 1, and measurement data taken with material influencing the radar radiation 3. For measuring the angular accuracy effects caused by the cover material 3, the radar sensor antenna 1 measures the elevation and azimuth angle of the received signal gone through the material, and the analyzing unit 4 compares this data with the measurement data of the elevation and azimuth angle of the radar sensor signal not gone through the cover material 3. For measuring the antenna beam pattern distortion caused by the cover material 3, the test antenna 2 measures the radar signals, emitted by the radar sensor antenna 1, gone through the material 3 and the analyzing unit 4 compares this data with the measurement data obtained when the test antenna 2 receives the radar radiation emitted by the radar sensor antenna 1 without going through the material 3.

Beside the given example for generating and receiving radar radiation, other implementations known to the person skilled in the art can be provided. In contrast to the presented array in FIG. 1, which shows a so called passive electronically scanned array (PESA) including several phase shifters and antenna elements, but only one transmitter/receiver per antenna, an active electronically scanned array (AESA)

antenna, which comprises a separate transmitter and/or receiver unit for each antenna element, can be implemented.

Advantageously, the test setup according to the present invention does not require corner reflectors to measure the angular accuracy impact of the cover material as known from state of the art solutions. The known state of the art method requires the measurement of corner reflector positions (R, azimuth, elevation) with the radom cover for several corner reflectors, which means increased effort and which is very time consuming. The test setup of the present invention allows the measurement of the angular accuracy impact of the cover material within seconds and additionally the measurement of the antenna beam pattern distortion caused by the antenna cover is possible within seconds.

Figure 2:
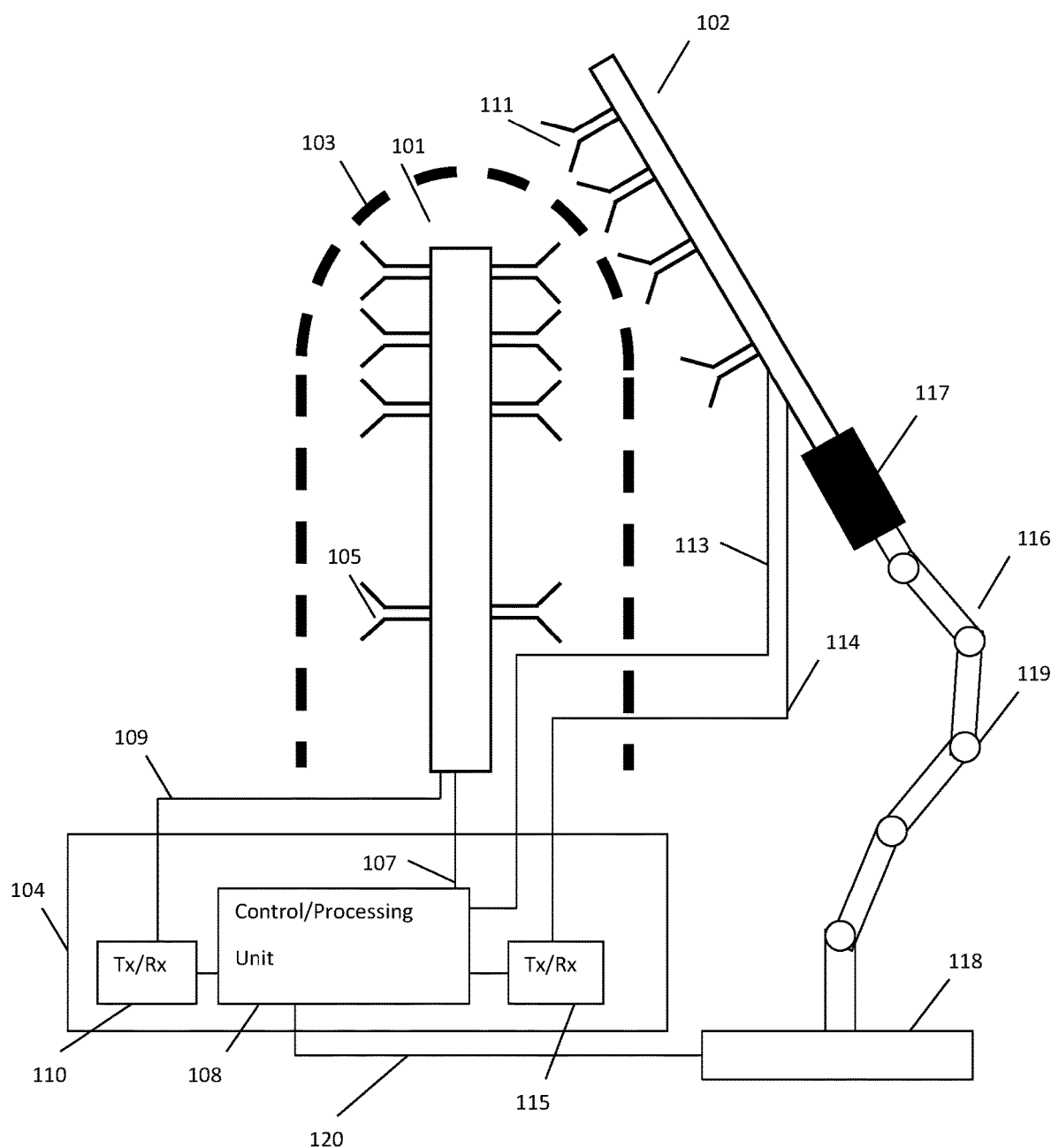
FIG. 2 shows a block diagram of an exemplary test setup including a robotic arm of the first aspect of the invention.

For an easier understanding of similar elements in different Figures, the number 100 has been added to the reference numbers given in FIG. 1 to number the elements in FIG. 2. FIG. 2 illustrates an exemplary test setup for measuring the impact of radar antenna covers, comprising a radar sensor antenna 101, a test antenna 102, a radar sensor cover 103, an analyzer unit 104 and a robotic arm 116 including a connection adapter 117 to connect the test antenna 102 to the robotic arm 116. To ensure mechanical stability and to fix the robotic arm, the robotic arm is mounted on a mounting plate 118.

The radar sensor antenna 101 may exemplarily be a multi-antenna array consisting of several antenna elements 105 each antenna element 105 being connected to a transmission/receiver unit 110 via a connection line 109 and with a process/control unit 108 via a connection line 107. In this exemplary case, not only a first antenna array is provided, but a duplicated second antenna array symmetrically mirrored to the first antenna array is shown. Additionally or alternatively, a radar sensor antenna with antenna arrays that are orientated in different directions in respect to the first antenna array are conceivable. Furthermore, the transmission/receiving unit 110 is connected to the control/processing unit 108.

In addition it is also conceivable that the transmission/receiving unit 110 and/or the transmission/receiving unit 115 and/or the control/processing unit 108 are provided as separate units and are not necessarily included into the analyzer unit 104.

The test antenna 102 comprises several antenna elements 111 in elevation and/or azimuth direction. Furthermore the antenna elements 111 are connected via a connection line 113 to the control/processing unit 108 that may be part of the analyzing unit 104, for configuring the phase of the applied signals. Furthermore, the antenna elements 111 are connected via a connection line 114 to a transmission/receiving unit 115 that may be part of the analyzing unit 104, configured to transmit/receive radar signals.

Based on several antenna elements 111, wherein each element 111 is configured to be switchable individually and controllable via the control/processing unit 108, it is possible to create a beam of radar waves that can be electronically steered to point in different directions, without moving the test antenna 102, and generate radar radiation that is identical to radar echos that are normally generated, when radar radiation is reflected by a real object. Thus, the test antenna is able to simulate targets.

Additionally to the radar beam movement generated electronically by controlling each single antenna element 111 independently, a robotic arm 116 is provided to allow a movement of the test antenna 102 to a desired location around the radar sensor antenna 101. In this exemplary case, the movement of the robotic arm 116 is realized by motors 119 that move the robotic arm 116 in x, y and z direction. The robotic arm is controlled by the control processing unit 108 and connected to the control/processing unit 108 via connection line 120. Since robotic arms are well known and available in different configurations, no more details are given regarding the robotic arm. Furthermore, a connection adapter 117 to connect the test antenna 102 to the robotic arm 116, and a mounting plate 118 to mount the robotic arm and ensure mechanical stability is shown.

Furthermore, FIG. 2 shows a material 103 that covers the radar sensor antenna 101. The material 103 is located between the radar sensor antenna 101 and the test antenna 102 and influences the radar radiation going through the material 103. However, during the measurements according to step 2, described in FIG. 3, and the measurements according to step 6, described in FIG. 4, no material is present between the two antennas 101, 102 to obtain reference data without a material influencing the radar radiation. For this reason, the cover material 103 is drawn with a dashed line, to point out that measurements are conducted with the material 103 between the two antennas 101, 102 and without the material 103 between the two antennas 101, 102.

The analyzing unit 104 compares measurement data, taken without material 103 influencing the radar radiation, such as a radom, bumper, weather shield or similar that covers the radar sensor antenna 101, and measurement data taken with material 103 influencing the radar radiation 103. For measuring the angular accuracy effects caused by the cover material 103, the radar sensor antenna 101 measures the elevation and azimuth angle of the received signal gone through the material 103 and the analyzing unit 104 compares this data with the measurement data of the elevation and azimuth angle of the radar sensor signal not gone through the cover material 103. For measuring the antenna beam pattern distortion caused by the cover material 103, the test antenna 102 measures the radar signals, emitted by the radar sensor antenna 101, gone through the material 103 and the analyzing unit 104 compares this data with the measurement data obtained when the test antenna 102 receives the radar radiation emitted by the radar sensor antenna 101 without going through the material 103.

Advantageously, the test setup according to the present invention does not require corner reflectors to measure the angular accuracy impact of the cover material as known from state of the art solutions. The known state of the art method requires the measurement of corner reflector positions (R, azimuth, elevation) with and without radom cover for several corner reflectors, which means a higher effort and is very time consuming. The test setup of the present invention, allows the measurement of the angular accuracy impact of the cover material 103 within seconds. The additional robotic arm 116 further reduces the testing time, since in addition to the beam movement performed without antenna movement the robot arm 116 movement can position the test antenna 102 and can define a rough scan position. The fine positioning, so called fine tuning of the beam is conducted by the electronic beam movement.

In addition, the robot arm 116 can be adapted to fulfill a further function, which is to place the radom/bumper 103 around the radar sensor antenna 101 or to remove the radom/bumper 103 being positioned around the radar sensor antenna 101 depending on the measurement step. This configuration is especially time saving when doing automated production line testing.

Figure 3:
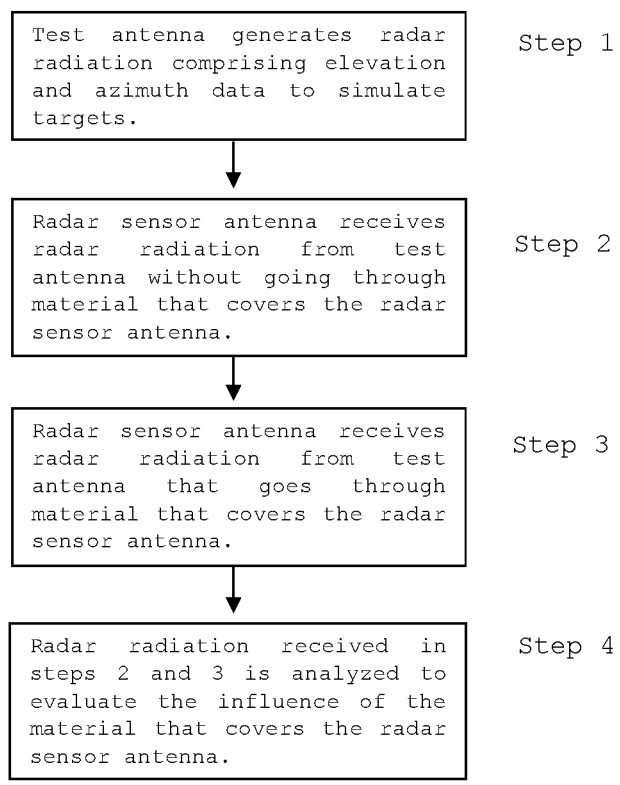
FIG. 3 shows a flow chart of exemplary testing method steps 1-4 of the second aspect of the invention.

FIG. 3 shows a flow chart of the inventive test method with the test antenna 2, 102 switched to transmission mode generating radar radiation and the radar sensor antenna 1, 101 switched to receive mode receiving radar radiation. In a first step 1, radar radiation comprising elevation and azimuth data, is generated by the test antenna 2, 102. Due to the elevation and azimuth data included in the radar radiation, radar waves that are comparable to radar waves reflected by a real object are generated, which allows a target simulation. In the next step 2, the radar sensor antenna 1, 101 receives the radiation from the test antenna 2, 102 without going through a material 3, 103 that covers the radar sensor antenna 1, 101. The measurement without any material 3, 103 between the radar sensor antenna 1, 101 and the test antenna 2, 102 is required as a reference measurement. In step 3, the radar sensor antenna 1, 101 receives the radar radiation generated from the test antenna 2, 102, wherein the radar radiation has gone through a material 3, 103 that covers the radar sensor antenna 1, 101.

Even though the material 3, 103 provides a high transparency to radar radiation and is as homogenous as possible to minimize the impact on the radiation passing through the material, there is an influence on the radar radiation going through the material that causes a beam pattern distortion and angular measurement errors. Step 4 analyzes the radar radiation received directly, without going through any material 3, 103 and the radar radiation received after having gone through a material 3, 103 that influences radar radiation. Based on a measurement without a sensor antenna cover 3, 103 and another measurement with a sensor antenna cover 3, 103, the impact of the cover 3, 103 on the radar radiation emitted from the test antenna is evaluated. The information related to the impact of the sensor antenna cover on the radar radiation is required to maintain angular accuracy of the radar sensor antenna, when a cover 3, 103 that influences the radar radiation by absorption, reflection or scattering, covers the radar sensor antenna 1, 101.

Figure 4:
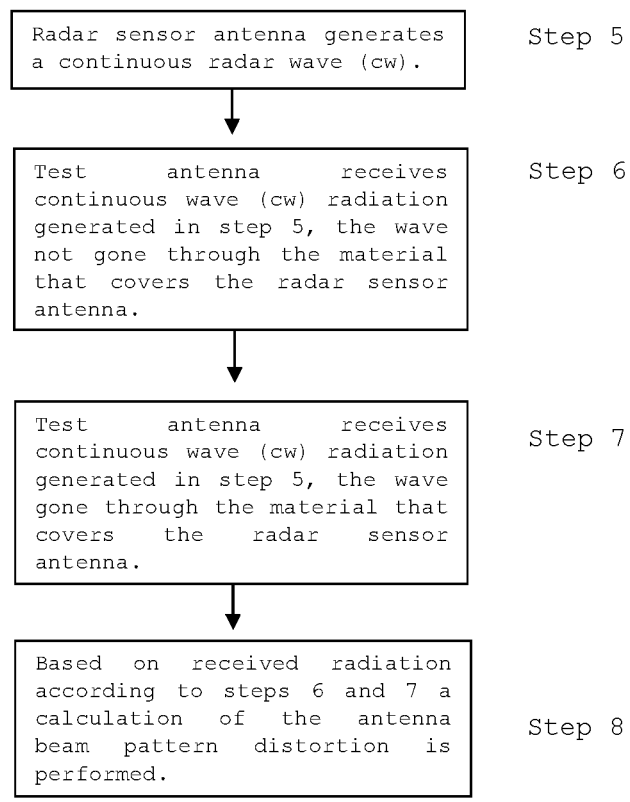
FIG. 4 shows a flow chart of exemplary testing method steps 5-8 of the second aspect of the invention.

Finally, FIG. 4 shows a flow chart of the inventive test method with the radar sensor antenna 1, 101 switched to transmission mode, generating a continuous radar wave (cw), and the test antenna 2, 102 switched to receive mode, receiving the radar waves emitted by the radar sensor antenna 1, 101. The generation of the continuous radar wave is shown in step 5 of the inventive test method. In step 6, the emitted continuous radar wave is received and measured by the test antenna 2, 102 without going through the material 3, 103 that covers the radar sensor antenna 1, 101. In step 7 the emitted continuous radar wave is received and measured by the test antenna 2, 102 having gone through the material 3, 103 that covers the radar sensor antenna 1, 101. In step 8, based on the two measurements, one measurement without the influence of the sensor antenna cover material 3, 103 and one measurement with the influence of the sensor antenna cover material 3, 103, the calculation of the antenna beam pattern distortion caused by the cover material 3, 103 is performed.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A test setup for measuring the impact of radar antenna covers comprising:
    a test antenna configured to generate radar radiation and to receive radar radiation;
    a radar sensor antenna configured to receive radar radiation and to generate radar radiation;
    a radar sensor antenna cover that covers the radar sensor antenna,
    wherein the test antenna comprises a plurality of antenna elements in elevation and/or azimuth direction; and
    an analyzer configured to evaluate the radar sensor antenna cover based on generated and received radar sensor antenna data or test antenna data based on first and second measurements with and without the radar sensor antenna cover;
    wherein the first measurement comprises a measurement of radar radiation comprising elevation and/or azimuth data,
    wherein the second measurement of radar radiation received by the test antenna, both without going through the material that covers the radar sensor antenna and going through the material that covers the radar sensor antenna, and
    wherein an estimation of an antenna beam pattern distortion of the radar sensor antenna is obtained based on the second measurement.

2. The test setup according to claim 1, wherein the radar radiation generated by the test antenna is such, that radar echos are emitted to simulate a target.

3. The test setup according to claim 1, wherein each of the test antenna elements is configured to be switchable individually.

4. The test setup according to claim 3, wherein the switchable test antenna elements are configured to form a beam.

5. The test setup according to claim 3, wherein the switchable test antenna elements are configured to form an interference signal.

6. The test setup according to claim 3, wherein the switchable test antenna elements are configured to form a multiple simulation signal to simulate multiple targets.

7. The test setup according to claim 1, wherein the radar sensor antenna is configured to measure the received signal from the test antenna.

8. The test setup according to claim 7, wherein the radar sensor antenna is configured to measure an angle and/or a range of signals and/or a Doppler signal and/or signal echo power.

9. The test setup according to claim 1, wherein the radar sensor antenna is a multi-antenna array.

10. A testing method for measuring the impact of radar antenna covers comprising:
    a first measurement of radar radiation comprising elevation and/or azimuth data, generated by a test antenna, wherein said radar radiation is received by a radar sensor antenna, both without going through a material that covers the radar sensor antenna and with going through the material that covers the radar sensor antenna, wherein the received radar radiation is analyzed by an analyzer to evaluate the influence of the material that covers the radar sensor antenna, and a second measurement of radar radiation received by the test antenna, both without going through the material that covers the radar sensor antenna and going through the material that covers the radar sensor antenna, and performing an estimation of an antenna beam pattern distortion of the radar sensor antenna, based on the second measurement.

11. The testing method according to claim 10, wherein the method further comprises the step of configuring the test antenna such that radar echos are generated to simulate a target.

12. The testing method according to claim 10, wherein the method further comprises the step of switching antenna elements individually to realize any switching combination of all available antenna elements.

13. The testing method according to claim 10, wherein the method further comprises the step that a beam is formed by the test antenna and/or wherein the method further comprises the step that an interference signal is formed by the test antenna.

14. The testing method according to claim 10, wherein the method further comprises the step that a multiple simulation signal is formed by the test antenna.

15. The test setup according to claim 10, wherein the method further comprises the step that the received signal from the test antenna is measured by the radar sensor antenna.

16. The testing method according to claim 15, wherein the method further comprises the step that an angle and/or a range of signals and/or a Doppler signal and/or signal echo power is measured by the radar sensor antenna.

* * * * *